(12) United States Patent
Emlinger

(10) Patent No.: US 9,042,577 B2
(45) Date of Patent: May 26, 2015

(54) AUTOMATED NOISE REDUCTION CIRCUIT

(75) Inventor: Dyke Thomas Emlinger, Lewisville, TX (US)

(73) Assignee: D. Thomas Emlinger, Lewisville, TX (US)

( * ) Notice: Subject to any disclaimer, the term of this patent is extended or adjusted under 35 U.S.C. 154(b) by 567 days.

(21) Appl. No.: 13/420,917

(22) Filed: Mar. 15, 2012

(65) Prior Publication Data

US 2012/0237056 A1    Sep. 20, 2012

Related U.S. Application Data

(60) Provisional application No. 61/454,116, filed on Mar. 18, 2011.

(51) Int. Cl.
| | |
|---|---|
| H04B 15/00 | (2006.01) |
| G10L 21/0208 | (2013.01) |
| H03F 1/30 | (2006.01) |
| H03G 3/34 | (2006.01) |

(52) U.S. Cl.
CPC .............. *H04B 15/005* (2013.01); *H04B 15/00* (2013.01); *G10L 21/0208* (2013.01); *H03F 1/305* (2013.01); *H03G 3/348* (2013.01)

(58) Field of Classification Search
CPC .. H04B 15/00; H04B 15/005; G10L 21/0208; H03G 3/348; H03F 1/305

USPC ............ 381/1, 2, 94.1, 94.6, 94.2, 94.3, 94.5, 381/94.7; 330/51, 69
See application file for complete search history.

(56) References Cited

U.S. PATENT DOCUMENTS

| | | | |
|---|---|---|---|
| 2007/0064094 A1* | 3/2007 | Potekhin et al. | 348/14.08 |
| 2009/0310520 A1* | 12/2009 | Yang et al. | 370/260 |
| 2011/0206208 A1* | 8/2011 | Augustyn et al. | 381/1 |

* cited by examiner

*Primary Examiner* — Vivian Chin
*Assistant Examiner* — William A Jerez Lora
(74) *Attorney, Agent, or Firm* — Michael A. Shimokaji

(57) ABSTRACT

An automated noise reduction circuit is configured to find an audio output with the lowest voltage level associated with undesirable noise. The circuit may include a plurality of audio input ports, ground isolation devices, electronic switches and a microprocessor. The microprocessor may be configured to toggle the ground isolation devices on and off, sample voltage at an output of the ground loop isolation transformers when the ground isolation devices are on and off, and switch the ground isolation devices to a position that produces a lowest voltage output based on a comparison of sampled voltage that is analyzed by a set of algorithms programmed into the microprocessor and that has been sampled from the output of the ground isolation devices for each of the multiple input ports.

12 Claims, 2 Drawing Sheets

AUTOMATED NOISE REDUCTION CIRCUIT

CROSS-REFERENCE TO RELATED APPLICATIONS

This application claims the benefit of priority of U.S. Provisional patent application No. 61/454,116, filed Mar. 18, 2011, which is herein incorporated by reference.

BACKGROUND OF THE INVENTION

The present invention generally relates to audio equipment, and more particularly, to an automatic noise reduction circuit.

While using audio equipment, for example, when audio sources are plugged into an audio mixer or amplifier, they can produce undesirable noise. In some cases, the noise may be prolonged and unnerving to listeners. For example, some audio connections can produce a low and agitating hum that can be distracting.

Some audio equipment such as audio amplifiers and audio mixers include ground-loop isolation circuits directly after the inputs so that the ground from an input device can be disconnected when unwanted ground plane noise is introduced into the amplified audio. In some cases, an audio circuit is designed so that a particular source and output device are contemplated and ground loop isolation circuits are then manually selected to adjust for the optimal noise level.

However, this approach may not account for the amplifier or mixer being difficult to reach or having numerous inputs. For example, in classroom or office settings, the amplifier or mixer may be located in the ceiling, another room or equipment rack, while the inputs are connected via an extended audio interface some distance away, perhaps mounted in the wall. In these situations, the audio amplifier of an audio system may be difficult to access, thus making the ground-loop isolation switches difficult to access. In addition, an audio system may have many inputs making ground-loop isolation selection complex and time consuming.

As can be seen, there is a need for a noise reduction circuit that can automatically and quickly detect the noise level of an audio connection and reduce the noise to desirable levels.

SUMMARY OF THE INVENTION

In one aspect of the present invention, a method for reducing noise in an audio system comprises receiving at least one audio input into an amplifier or mixer with a single or multiple input ports; analyzing that signal with a microprocessor at some point in the audio path after it has passed through a ground isolation circuit. In this case the ground isolation device could use several different methods such as 1) ground-loop isolation transformers, 2) optical isolators also known as opto-isolators, 3) capacitive decouplers or, 4) any other decoupling technology currently employed or yet to be invented. At this point a microprocessor engages the ground path from the input (which bypasses the ground isolation device), samples the levels of audio multiple times via the analog to digital processor, then disengages the ground path from the input (which engages the ground isolation device) and repeats the sampling process. Once two different levels have been determined, the microprocessor makes a decision based on the comparison of the two samples whether that particular ground path should be engaged or not thus determining the lowest voltage output or noise level for the audience.

In another aspect of the present invention, a automatic noise reduction circuit includes a plurality of audio input ports; multiple ground isolation devices coupled to the plurality of audio input ports; and a microprocessor connected to some point at or after the output of the ground isolation devices, the microprocessor configured to: toggle the ground isolation devices on and off, sample voltage at some point at or after the output of the ground isolation device, while the ground isolation devices are on and off, and switch the ground isolation device to a state that produces a lowest voltage output based on a comparison of sampled voltage at the output of the ground isolation device for each of the multiple input ports.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide an automatic noise reduction circuit that is configured to automatically analyze noise from or caused by connecting various input devices into a common output device. In one aspect, a reducing noise in an audio system includes receiving at least one audio input into an amplifier or mixer with a single or multiple input ports. That signal may be analyzed with a microprocessor at some point in the audio path from the input port to the output device after the signal has passed through a ground isolation circuit. The microprocessor may be configured to toggle the ground isolation devices on and off and sample voltage at some point at or after the output of the ground isolation device, while the ground isolation devices are on and off. For example, the microprocessor may engage the ground path from the input (which bypasses the ground isolation device), samples the levels of audio signal multiple times using an analog to digital processor portion of the microprocessor, then may disengage the ground path from the input (which engages the ground isolation device) and repeats the sampling process. Once two different levels have been determined, the microprocessor makes a decision based on the comparison of the two samples whether that particular ground path should be engaged or not thus determining the lowest voltage output or noise level for the audience. The microprocessor may then switch the ground isolation device to a state that produces a lowest voltage output based on the comparison of sampled voltage at the output of the ground isolation device for each of the multiple input ports.

Figure 1:
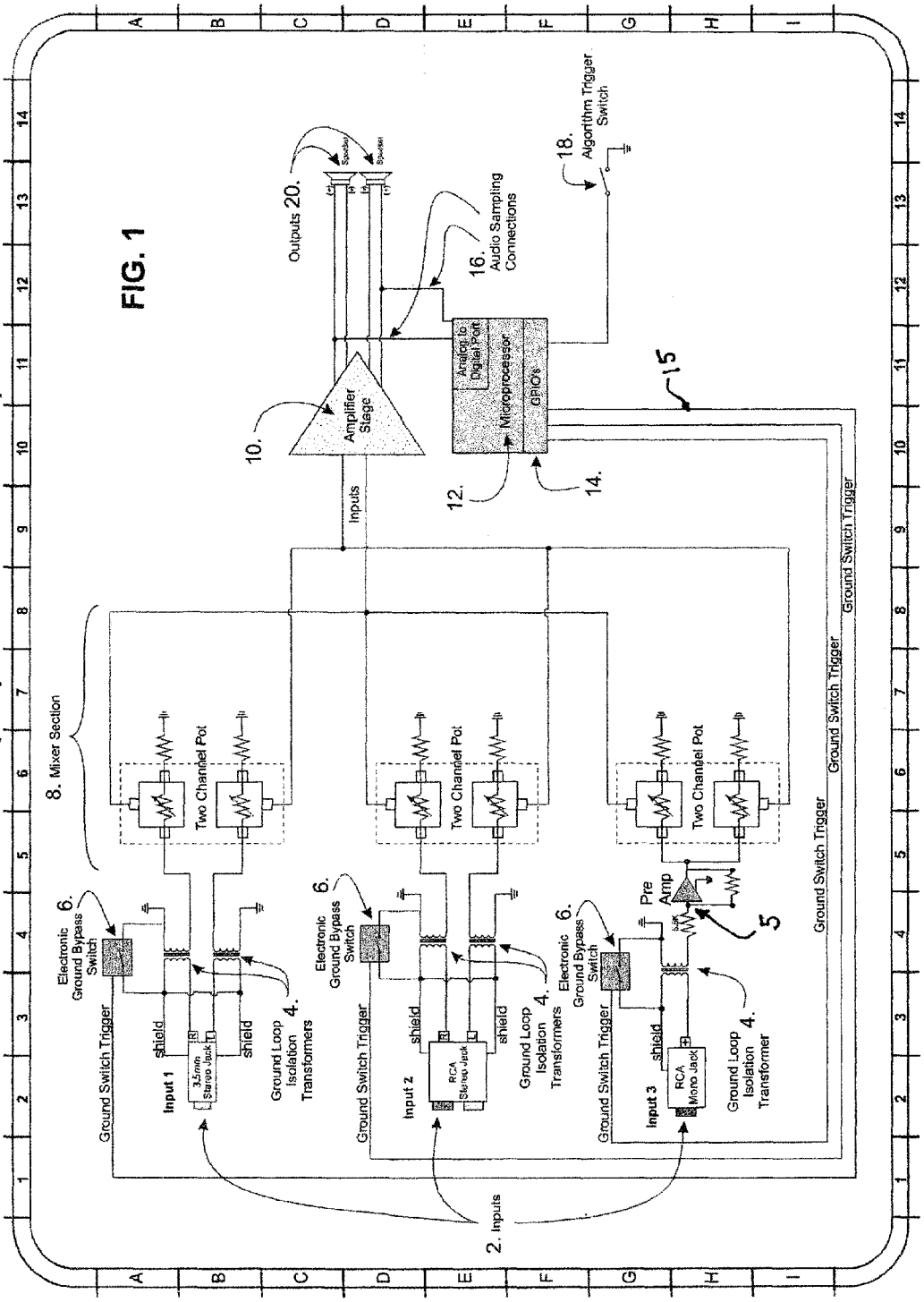
FIG. 1 is a schematic diagram of an automatic noise reduction circuit according to an exemplary embodiment of the present invention.

Referring now to FIG. 1, a schematic diagram of an automated noise reduction circuit 100 is shown. The automatic noise reduction circuit 100 may be designed, for example, to achieve automated selection of ground isolation devices 4 in an audio system to produce the least amount of noise from an output device 20. The noise reduction circuit 100 may include one or more audio input ports 2 (shown for example, as input 1, input 2, and input 3), a plurality of ground isolation devices 4, a microprocessor 12, and the output device 20. The ground isolation devices 4 may be, for example, ground-loop isolation transformers, optical isolators also known as opto-isolators, or capacitive decouplers. The input ports 2 may be of different types. In an exemplary embodiment, there may be one or two ground isolation devices 4 for every audio input port 2. Each ground isolation device (or set of ground isolation devices for stereo) 4 may be coupled to an associated audio input port 2.

An electronic ground bypass switch 6 may be coupled between the input side of ground isolation devices 4 and the ground of the mixing or amplifying device that it is plugged into. In some exemplary embodiments where an audio input port 2 includes multiple output ports, each of the output ports may be coupled to a dedicated ground isolation device 4.

A mixer section 8 may be coupled to the output side of ground isolation devices 4. In some exemplary embodiments, a pre-amp circuit 5 may be disposed between the output side of a ground isolation device 4 and the input side of a mixer section 8. The mixer section 8 may be a two channel potentiometer circuit. In an exemplary embodiment, the noise reduction circuit 100 may include one mixer section 8 for each input port 2. One output channel from a potentiometer of each mixer section 8 may be coupled to one or more channels of a potentiometer from the other mixer sections 8.

An amplifier 10 may be connected to an output channel of each of the mixer sections 8. The microprocessor 12 may be connected to the output of the amplifier 10. However, it will be understood that in some embodiments, the microprocessor may be connected somewhere along the audio signal path other than to the amplifier 10 as long as it is disposed to receive the output generated beyond the isolation device 4 sections of the circuit. In one exemplary embodiment, the microprocessor 12 may include an analog to digital converter 12 configured to receive signal outputs through audio sampling connections 16 from the amplifier 10. The microprocessor 12 may also include a general purpose input/output port (GPIO) 14 connected to ground switch trigger lines 15 connected to the electronic ground bypass switches 6. The microprocessor 12 may automatically select the lowest noise level by controlling electronic switches 6 to automatically determine the best state of the ground isolation device 4 that creates the lowest voltage output.

Different embodiments of the present invention may use either a local button 18 on the amplifier or a remote button 18 (e.g., when the amplifier or mixer is not easily accessible) that initiates an algorithm within a microprocessor 12 that checks for the best solution for multiple audio inputs 2, thus saving time and effort.

Figure 2:
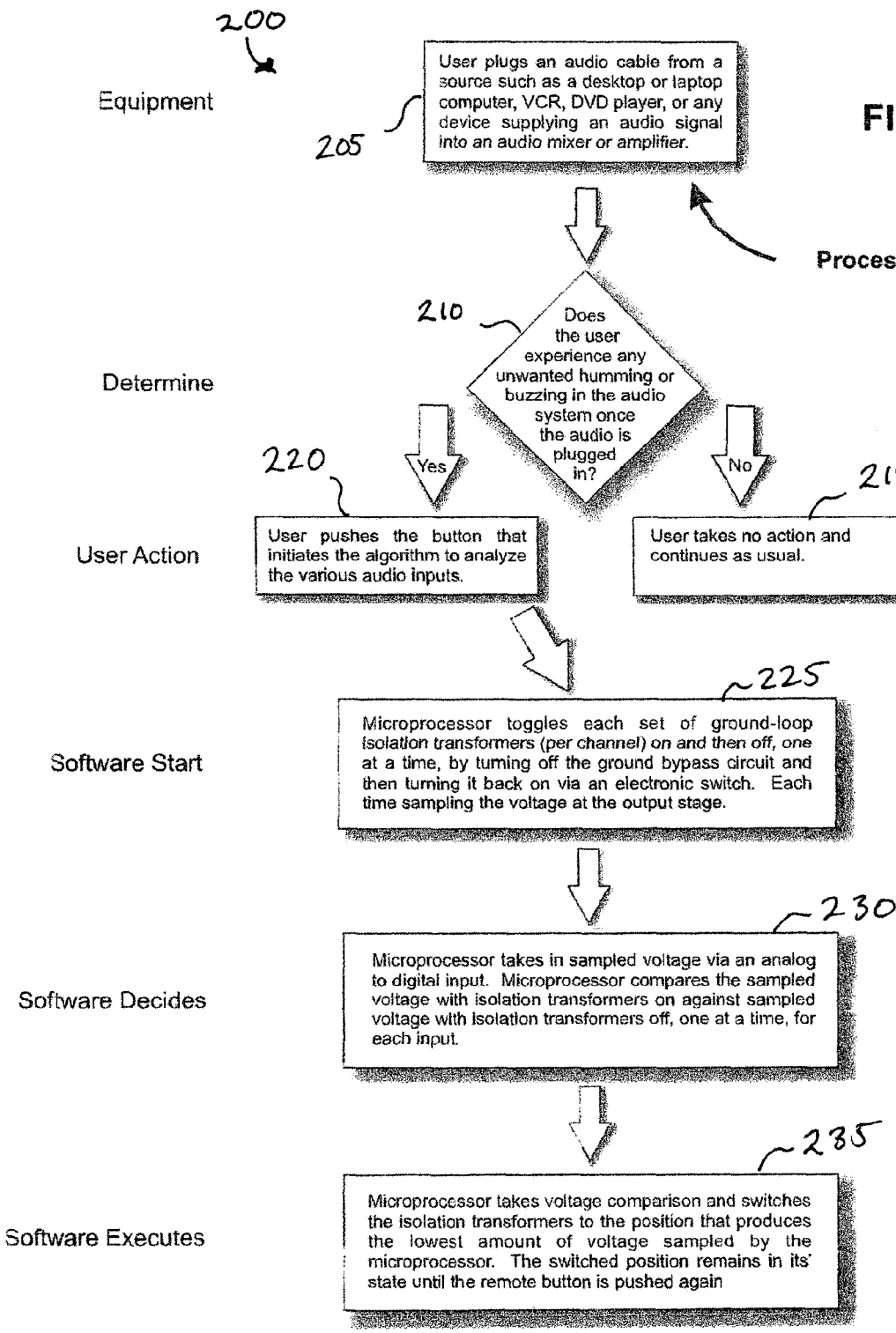
FIG. 2 is a flowchart illustrating a series of steps according to another exemplary embodiment of the present invention.

Referring now to FIG. 2, an exemplary method 200 for automatically reducing noise in audio systems using a circuit according to exemplary embodiments of the present invention is shown. In step 205, a user proceeds by first plugging an audio cable from an audio source (e.g., computer, VCR, DVD player, etc.) into an audio mixer or amplifier. For example, a teacher in a classroom may plug in a computer to a wall jack that is installed in the classroom. The wall jack may carry the audio signal from the source to an audio mixer or amplifier that may be installed in a hard to reach area and/or have multiple audio inputs.

In step 210, the user may determine whether any unwanted noise such as humming or buzzing in the audio system occurs after the audio source is connected. If no noise is detected, the user may proceed as usual in step 215. However, if noise is detected, in step 220, the user may engage a remote button or a button on the audio mixer or amplifier itself initiating operation of the microprocessor to minimize the noise output from the system. For example, upon initiation, the microprocessor may determine that a request has been sent to analyze the audio inputs and looks for unwanted noise. It may be preferable that audio signals are not playing during the analyzing process.

In step 225 the microprocessor may send signals to a solid state switch or relay that engages and then disengages a ground loop bypass circuit configured to bypass ground isolation devices for each input, for example, in a sequential manner. Each time the input ground isolation devices are toggled, the microprocessor samples the output voltage level for the input port.

In step 230, the microprocessor may receive the sampled voltage from the output via its analog to digital input. The microprocessor may take multiple samples many times per second while searching for and selecting the greatest peak of the signal and the lowest valley, at which point it may determine the difference between the two using a variety of algorithms. For example, 3000 samples may be processed per second. The microprocessor may then store value representing the difference. The microprocessor may then compare the sampled voltage output with ground isolation devices on against sampled voltage with ground isolation devices off, one at a time for each input port.

In step 235, the microprocessor may determine which combination of ground isolation devices being enabled and disabled produced the lowest signal or noise level. The microprocessor may control the ground isolation devices to move to the position (e.g. toggled on or off) that produces the lowest amount of voltage sampled by the microprocessor. The switched position may remain in its state until the button to initiate the process is pushed again.

It should be understood, of course, that the foregoing relates to exemplary embodiments of the invention and that modifications may be made without departing from the spirit and scope of the invention as set forth in the following claims.

What is claimed is:

1. A method for automatically reducing noise in an audio system, comprising:

receiving at least one audio input in a system with one or multiple input audio ports, a mixer section, and an amplifier stage, wherein the one or multiple input audio ports are input to the mixer section and an output of the mixer section is input to the amplification stage;

receiving a signal, from a user via a user interface, into a microprocessor that causes the microprocessor to analyze a voltage output, from the amplifier stage, associated with the audio input for one or more of the input ports, in response to receiving the signal;

toggling ground isolation devices, associated with the one or more audio input ports, bypassed and not bypassed, wherein at least one output connection of at least one audio input port remains grounded irrespective of whether the at least one ground isolation device is bypassed and not bypassed;

sampling voltage at an output of the amplifier stage when the ground isolation devices are bypassed and not bypassed;

determining a state of the ground isolation devices that produce a lowest voltage output; and switching the ground isolation devices to the state that produces the determined lowest voltage output.

2. The method of claim 1 comprising receiving the sampled voltages, of the output of the amplifier stage, via an analog to digital converter connected to a microprocessor.

3. The method of claim 1 comprising comparing to one another the sampled voltage at the output of the amplifier stage for each state of the ground isolation devices.

4. The method of claim 1 comprising determining a combination of ground isolation devices in states that produce the lowest output voltage.

5. The method of claim 1 wherein the sampling includes taking multiple samples to find a highest peak and lowest valley among the sampled signals.

6. A noise reduction circuit including:
one or more audio input ports;
one or more ground isolation devices coupled to the one or more audio input ports, wherein one or more input devices include a signal path via a ground path with the one or more ground isolation devices; and
a microprocessor connected to a summed, amplified, output of the one or more ground isolation devices, the microprocessor configured to:
receive an initiation signal,
toggle the ground isolation devices between a bypass mode and a not bypassed mode,
sample voltage at the summed, amplified, output of the ground isolation devices when the ground isolation devices are bypassed and not bypassed, and
switch the ground isolation devices to a position that produces a lowest voltage output based on a comparison of sampled voltage at the output of the ground isolation devices for each of the multiple input ports.

7. The automated noise reduction circuit of claim 6 including a mixer section connected between an amplified, summed, output side of the ground isolation devices and the microprocessor.

8. The automated noise reduction circuit of claim 7 wherein the mixer section is a two channel circuit.

9. The automated noise reduction circuit of claim 6 wherein at least two of the plurality of audio input ports are of different type ports.

10. The automated noise reduction circuit of claim 6 wherein the one or more ground isolation devices are ground-loop isolation transformers.

11. The automated noise reduction circuit of claim 6 wherein a user initiates a noise reduction process via either: a remote button or a local button.

12. The automated noise reduction circuit of claim 6 wherein an audio signal is sampled after signal mix and amplification processes have already taken place for maximum sampling resolution.

* * * * *